United States Patent [19]

Compton

[11] 4,176,368
[45] Nov. 27, 1979

[54] JUNCTION FIELD EFFECT TRANSISTOR FOR USE IN INTEGRATED CIRCUITS

[75] Inventor: James B. Compton, Los Gatos, Calif.

[73] Assignee: National Semiconductor Corporation, Santa Clara, Calif.

[21] Appl. No.: 949,831

[22] Filed: Oct. 10, 1978

[51] Int. Cl.² .................................... H01L 29/80
[52] U.S. Cl. .................................. 357/22; 357/41; 357/43
[58] Field of Search ........................ 357/22, 41, 43

[56] References Cited

U.S. PATENT DOCUMENTS 3,656,031  4/1972  Breese et al. ........................ 357/22

Primary Examiner—Edward J. Wojciechowicz
Attorney, Agent, or Firm—Gail W. Woodward

[57] ABSTRACT

A junction field effect transistor is incorporated into a conventional monolithic bipolar integrated circuit using compatible processing steps. The transistor source and drain regions are produced during IC base diffusion and the gate contact during IC emitter diffusion. A channel is ion implanted in the region between source and drain. A second, shallower, opposite conductivity ion implant is applied over the channel so as to overlap and cover. Thus, a subsurface channel is created. A third ion implant of slightly deeper character and to a much heavier dosage is created in the region between and separated from the source and drain using an impurity of the same conductivity type as the second ion implant. This third ion implant is designed to span the channel without contacting either the source or drain, thus creating a top gate ohmically connected to the bottom gate.

10 Claims, 2 Drawing Figures

U.S. Patent  Nov. 27, 1979  4,176,368
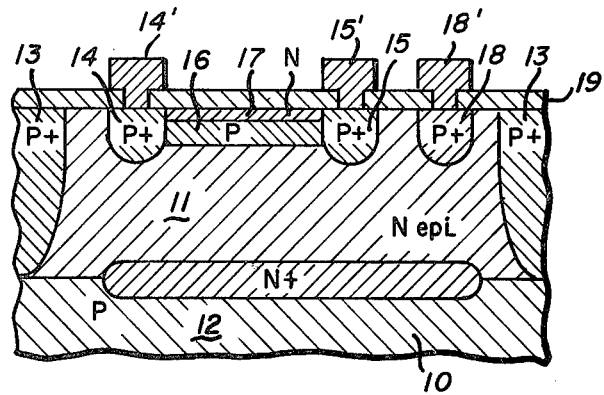
Fig_1 (PRIOR ART)
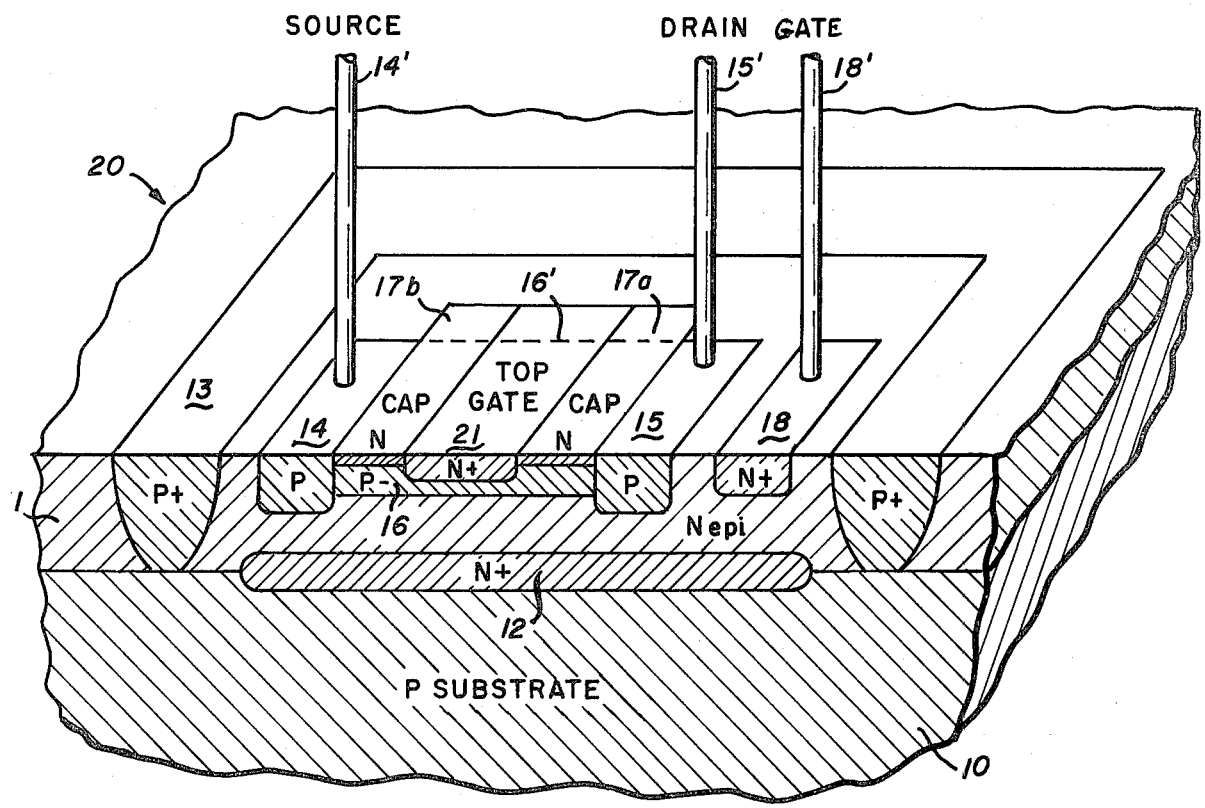
Fig_2

JUNCTION FIELD EFFECT TRANSISTOR FOR USE IN INTEGRATED CIRCUITS

BACKGROUND OF THE INVENTION

The invention relates to an improved junction field effect transistor (JFET) that can be incorporated into a conventional bipolar monolithic integrated circuit. It has been found that when JFETs are combined with bipolar junction transistor (BJT) devices, circuits having highly desirable characteristics can be obtained. It has also been found that extremely useful circuits can be fabricated in monolithic IC form using a JFET structure that can be fabricated into a conventional bipolar IC using conventional techniques. Such a JFET structure is disclosed in copending application serial number 716,049 filed Aug. 20, 1976, by James L. Dunkley and Robert C. Dobkin, which is a continuation of application Ser. No. 575,418 filed May 7, 1975, and now abandoned. While the combined JFET-BJT IC designs have proven highly useful, it would be desirable to improve the charateristics and parameter control of the JFET.

SUMMARY OF THE INVENTION

It is an object of the invention to provide an improved JFET structure capable of integration into a conventional IC.

It is a further object of the invention to produce an IC having incorporated therein an improved JFET that requires no added process complexity and uses the conventional process technology.

These and other objects are achieved in a JFET created by ion implantation to produce a structure that has its critical operating elements just under the surface of the semiconductor in which the IC is fabricated. The improved JFET is fabricated inside an isolated portion of an epitaxial layer that is located on a conventional IC substrate. Typically the isolated portion will have a conductive buried layer located at the substrate-epitaxial layer interface. Source and drain electrodes are established in spaced relationship by diffusion during the conventional BJT base diffusion step in the IC process. An ohmic contact to the isolated portion of the epitaxial layer is created during the BJT emitter diffusion step. Then the JFET channel is created by ion implantation in the region separating the source and drain electrodes. This ion implant energy is adjusted to create a channel having a flat impurity concentration to about 0.3 micron below the semiconductor surface and a dosage that produces the desired channel conductivity. The channel impurity is necessarily the same type as used in the source and drain diffusion. Then the channel is covered with a second ion implant that in fact overlaps the channel. This second implant uses an impurity that has the opposite conductivity type of that of the channel impurity. The ion energy is adjusted so that the penetration is limited to a penetration of about 500 Å below the semiconductor surface and the dosage is adjusted to produce an impurity concentration about the same level as that of the channel or slightly greater (but of the opposite conductivity type). Thus, the channel is buried below the semiconductor surface by a cap of the opposite conductivity type which by virtue of its channel overlap makes ohmic contact to the epitaxial layer. Then a third ion implant is applied using the same impurity (or impurity type) as the cap but confined to the central portion of the cap away from the source and drain diffusions. This ion implant is adjusted to a higher energy and to have a much heavier dosage (one to two orders of magnitude greater than the cap dosage) and is located so as to span the cental portion of the channel. This creates a heavily doped top gate that is also ohmically connected to the epitaxial layer. The ohmic connection to the epitaxial layer is now the JFET gate terminal and it is directly connected to the top gate as well as the epitaxial layer which produces gate action at the underside of the channel. The JFET thus produced has greatly improved pinch off or gate control characteristics while retaining the desired high gate voltage breakdown and low leakage characteristics.

BRIEF DESCRIPTION OF THE DRAWING

FIG. 1 is a cross section of the prior art JFET; and
FIG. 2 is a combined cross section and surface elevation view of the JFET of the invention.

DESCRIPTION OF THE PRIOR ART

FIG. 1 shows the structure disclosed in above-mentioned application Ser. No. 716,049 filed Aug. 20, 1976. The device is fabricated into the surface of a conventional monolithic IC that employs BJT's. Substrate 10 is the conventional p type wafer. It is to be understood that the wafer includes other conventional IC devices (not shown) and a plurality of identical IC chips are fabricated simultaneously in a single wafer. The section illustrated is only a fragment of an IC chip containing the device of interest. The dimensions employed in the drawing are not to scale but are greatly exaggerated to illustrate the structural details.

An epitaxial n type layer 11 is grown on wafer 10 and the structure is shown with an optional buried n+ layer 12. An isolation diffusion ring 13 surrounds buried layer 12 and extends completely through the epitaxial layer 11 so as to isolate a portion of the n type material by a p n junction. During the BJT base diffusion step, source and drain regions 14 and 15 are created. During BJT emitter diffusion, ohmic contact region 18 is created. Metal contacts 14', 15', and 18' will provide connections to the completed JFET. After all of the bipolar device high temperature processes have been completed the JFET is completed as follows.

Channel 16 is ion implanted using a p type impurity such as boron. The implant is controlled to produce an impurity peak about 0.3 micron below the surface and having a conductivity suitable for a JFET channel. Then a second ion implant is employed to create top cap 17 using an n type impurity such as arsenic or phosphorus. This ion implant is adjusted to have a depth of less than about 0.1 micron and a conductivity that is a compromise between top gate action and gate breakdown voltage. Typically cap 17 is made about twice as conductive as channel 16. The structure is shown as being completed by a conventional passivating oxide 19.

When cap 17 is created the ion implant is contoured to overlap channel 16. Thus, the channel is completely subsurface and free of surface effects. Where cap 17 overlaps epitaxial layer 11 it will be ohmically connected thereto. Where the overlap encounters source and drain regions 14 and 15, the ion implant will be overpowered and will have no discernible effect. Electrically cap 17 acts as a top gate with respect to channel 16 while epitaxial layer 11 acts as a bottom gate. The two gates in parallel are electrically available at metal 18'.

The structure described confines all of the device action to a subsurface region in the semiconductor but less than a micron in overall thickness. The resulting JFETs have good performance, due largely to their exceptional thinness. Such a structure cannot be made by conventional diffusion processes. In diffusion, the conditions necessary to obtain a required doping density would result in diffusion that would make the layers much thicker than is necessary for good device performance. Of the available production processes, only ion implantation is capable of producing the required impurity profiles.

DESCRIPTION OF THE INVENTION

The JFET of the invention is shown in FIG. 2. Where possible the element numbers of FIG. 1 are used to refer to like elements in FIG. 2. The oxide layer has been omitted for clarity and the IC chip fragment 20 is shown partly in section and partly in a front elevation to show electrode layout as well as the layer structure. The topography shown would have its mirror counterpart present to complete the structure. While a rectangular form is shown, other geometries are possible.

The p type substrate 10 is typically a 15–20 mil thick wafer of about 4 ohm-cm p type resistivity. Epitaxial layer 11 is typically about 15 microns thick and doped to a level of about $10^{15}$ atoms/cm$^3$ with an n type impurity such as arsenic. Buried layer 12 is heavily doped with arsenic or antimony. Isolation diffusion 13 is heavily boron doped. Source and drain diffusions are achieved when the BJT device bases are diffused in IC fabrication and they will typically be about 3 microns deep and doped with boron to about $2 \times 10^{18}$ atoms/cm$^3$ at the surface. Gate contact 18 is a BJT emitter diffusion about 2 microns deep and is heavily doped. (Typically phosphorus with a surface concentration of greater than $10^{20}$ atoms/cm$^2$.)

Once all of the IC diffusions are completed (typically emitter diffusion is last high temperature step) the remainder of the structure is ion implanted after which no high temperature processes are employed. The ion implantation is conventional and involves the creation of a suitable ionic species, acceleration to high velocity, and impingement through a suitable mask on the semiconductor surface. The acceleration potential (and the mass of the ion) determines ion energy and, therefore, the degree of penetration of the particular impurity. The total impurity deposited is a function of integrated ion current over the deposition time. The resulting doping can be relatively precisely controlled. As is conventional with ion implant, an anneal is employed during or subsequent to implantation to restore semiconductor carrier lifetime but overheating that would substantially shift the impurities by diffusion is avoided. When the IC employs ion implanted resistors, some of the JFET structure can be done along with resistor implantation. Since ion implantation is a wellknown art process, further details will not be presented herein.

In a first implant channel region 16 is boron implanted to a dose of about $10^{12}$ atoms/cm$^2$ with the penetration set to give a uniform penetration to a depth of about 0.3 micron. This ion implant is done through a mask that confines the channel to the region between source and drain electrodes 14 and 15 as shown by dashed line 16'. Typically the mask is caused to overlap the source and drain slightly so that minor misalignments will have no effect. Since the source and drain are already p type, this overlap will have no discernible effect. Then the channel is overcoated with an n type cap designated as 17a and 17b. This cap completely covers channel 16 and substantially overlaps it. Phosphorus is ion implanted to a peak depth of about 500 Å and a dosage of about $10^{12}$ atoms/cm$^2$. Where this layer overlaps the n type epitaxial material it makes ohmic contact thereto. Where it overlaps the source and drain 14 and 15, the boron doping overpowers the ion implant and such overlap has no effect except to permit minor mask misalignment.

Finally, top gate 21 is ion implanted through a mask that causes it to span the channel and yet remain clear of the source and drain diffusions as shown. The top gate is ion implanted to a dose of greater than $10^{13}$ atoms/cm$^2$ with a penetration depth that is less than that of the channel. This can be on the order of 0.15 micron for a 0.3 micron channel. This implant overpowers and operates through cap 17 to create sections 17a and 17b as shown. As a practical matter it is desirable to make top gate 21 as wide as possible without touching either electrode 14 or 15. In a JFET design where the source to drain spacing is about one mil, a 0.3 mil wide top gate will make each top cap slightly greater than 0.3 mil. This is representative of readily achievable state of the art capability.

Since the top gate is heavily doped, it will produce a more pronounced gate action and enhance channel pinch off with the application of reverse gate bias. In the prior art structure the top cap will provide some gate action but its doping must be low enough to provide a suitably high reverse breakdown voltage. If the top cap were doped to optimize the gate pinch off action, the gate breakdown voltage would be seriously reduced because the top cap abuts the heavily doped source and drain diffusions.

In the device of the invention the n caps 17a and 17b can be optimized for breakdown voltage while providing a suitable channel cap. Top gate 21 can then be optimized for the desired gate action without compromising gate breakdown voltage. In this improved structure most of the gate action actually occurs under the top gate. However, the bottom gate is still effective along the entire channel length although it comprises less than 20% of the effective gating action.

While not shown, the surface of the device will be covered by the conventional protective oxide and a layer of metal interconnect lines. Wires 14', 15', and 16' are to schematically represent source, drain, and gate connections. While the source and drain have been specifically identified as 15 and 16, the device is bidirectional and either 15 or 16 can act as source or drain.

The invention has been described and a preferred structure disclosed. Clearly there are modifications and equivalents within the spirit and intent of the invention that will occur to a person skilled in the art. For example, all of the conductivity types could be complemented by using p impurities in place of the n as shown and vice versa. Also, while a single JFET is shown within isolation ring 13, more than one device could be fabricated in a common section of isolated epitaxial layer. In this case all of the JFETs so combined would have a common gate connection. In this configuration a single gate input could be used to simultaneously modulate a plurality of separate source to drain paths. In addition, other elements of an IC could be incorporated into the isolated section containing one or a plurality of JEFTs. Accordingly, it is intended that the scope of the invention be limited only by the claims that follow.

I claim:

1. A junction field effect transistor for incorporation into a bipolar semiconductor integrated circuit substrate, said transistor comprising:
a gate region of one conductivity type into which said transistor is to be fabricated;
a pair of spaced apart regions of the opposite conductivity type extending into said gate region from the surface thereof, said spaced apart regions forming source and drain electrodes in said transistor;
a subsurface channel of said opposite conductivity type extending between said pair of spaced apart regions, said channel extending to a depth in said semiconductor that is substantially less than the depth of said spaced apart regions;
a first ion implanted surface layer of said one conductivity type completely covering and overlapping said channel so as to form an ohmic connection with said gate region, said first ion implanted surface layer having a thickness that is small relative to the thickness of said channel;
a second ion implanted surface layer of said one conductivity type located in the space between said spaced apart regions and extending to completely span said channel thereby to make an ohmic connection to said gate region, said second ion implanted surface layer having a substantially greater conductivity and extending below said surface to a greater extent than said first ion implanted surface layer; and
ohmic connections to said pair of spaced apart regions and said gate region to complete said source, drain, and gate electrodes.

2. The transistor of claim 1 wherein said channel is ion implanted and has a conductivity that is substantially less than that of said spaced apart regions.

3. The transistors of claim 2 wherein said channel extends below said surface less than about one micron, said first ion implanted surface layer is less than about 0.1 micron in thickness and said ion implanted surface layer is less than about 0.5 micron in thickness.

4. The transistor of claim 1 wherein said gate region comprises an isolated portion of an epitaxial layer located on a semiconductor substrate wafer that additionally includes bipolar junction transistors therein.

5. The transistor of claim 4 wherein said spaced apart regions are fabricated during bipolar function transistor base diffusion and said ohmic connection to said gate region includes a region formed during bipolar junction transistor emitter diffusion.

6. The transistor of claim 5 wherein said isolated portion includes a conductive buried layer to reduce the gate resistance of said transistor.

7. The transistor of claim 6 wherein said gate is n type and said spaced apart regions p type.

8. A monolithic semiconductor integrated circuit having bipolar junction transistors that incorporate emitter and base elements diffused into collector element semiconductor material and including at least one junction field effect transistor fabricated therein using compatible construction techniques, said junction field effect transistor comprising:
a gate region located in a portion of said collector element semiconductor material;
spaced apart source and drain regions composed of said base element material;
a subsurface channel region located less than about one micron below the surface of said semiconductor and extending between said source and drain regions;
a surface cap covering and overlapping said channel region, said cap being of the same conductivity type as said gate, in ohmic contact with said gate in the region of overlap, and extending below the surface of said semiconductor to a depth that is small compared to the depth of said channel;
an ion implanted top gate layer located to span said channel but spaced away from said source and drain regions, said top gate having the same conductivity type and substantially greater doping than said surface cap and extending to a substantially greater distance below said semiconductor surface but to a depth less than the depth of said channel region; and
means for making connection to said source, drain and gate regions.

9. The monolithic integrated circuit of claim 8 where said circuit includes regions of p n junction isolated semiconductor material and said junction field effect transistor is fabricated into one such isolated region.

10. The monolithic integrated circuit of claim 9 wherein said isolated region is formed over a highly conductive buried layer whereby the gate resistance of said junction field effect transistor is lowered.

* * * * *